United States Patent
Behzad

(10) Patent No.: US 8,670,729 B2
(45) Date of Patent: *Mar. 11, 2014

(54) METHOD AND SYSTEM FOR LEVEL DETECTOR CALIBRATION FOR ACCURATE TRANSMIT POWER CONTROL

(75) Inventor: Arya Behzad, Poway, CA (US)

(73) Assignee: Broadcom Corporation, Irvine, CA (US)

(*) Notice: Subject to any disclaimer, the term of this patent is extended or adjusted under 35 U.S.C. 154(b) by 102 days.

This patent is subject to a terminal disclaimer.

(21) Appl. No.: 12/725,185

(22) Filed: Mar. 16, 2010

(65) Prior Publication Data

US 2010/0173597 A1 Jul. 8, 2010

Related U.S. Application Data

(63) Continuation of application No. 11/618,832, filed on Dec. 31, 2006, now Pat. No. 7,697,903.

(60) Provisional application No. 60/868,818, filed on Dec. 6, 2006.

(51) Int. Cl.
*H04B 1/04* (2006.01)
*H03C 1/62* (2006.01)
*H04B 17/00* (2006.01)
*H01Q 11/12* (2006.01)

(52) U.S. Cl.
USPC .............. 455/115.1; 455/114.2; 455/115.2; 455/127.1

(58) Field of Classification Search
USPC ........ 455/126, 127.1–127.5, 91, 114.2–115.4
See application file for complete search history.

(56) References Cited

U.S. PATENT DOCUMENTS

| | | | | |
|---|---|---|---|---|
| 5,327,583 A * | 7/1994 | Yamada et al. | ............... | 455/572 |
| 5,383,223 A * | 1/1995 | Inokuchi | ............... | 375/297 |
| 5,724,003 A * | 3/1998 | Jensen et al. | ............... | 330/129 |
| 6,282,411 B2 * | 8/2001 | Higuchi | ............... | 455/127.1 |
| 7,248,842 B2 * | 7/2007 | Takano et al. | ............... | 455/102 |
| RE40,031 E * | 1/2008 | Goos | ............... | 455/127.1 |
| 7,529,523 B1 * | 5/2009 | Young et al. | ............... | 455/115.1 |
| 7,546,137 B2 * | 6/2009 | D'Hont et al. | ............... | 455/522 |
| 7,567,788 B2 * | 7/2009 | Newton et al. | ............... | 455/237.1 |
| 7,689,182 B1 * | 3/2010 | Bosley et al. | ............... | 455/127.1 |
| 7,697,903 B2 * | 4/2010 | Behzad | ............... | 455/91 |
| 7,893,761 B2 * | 2/2011 | Fulga | ............... | 330/124 R |
| 7,920,836 B2 * | 4/2011 | Rozenblit et al. | ............... | 455/127.1 |
| 7,962,108 B1 * | 6/2011 | Khlat et al. | ............... | 455/114.3 |
| 2002/0000866 A1 * | 1/2002 | Weiss et al. | ............... | 327/494 |
| 2002/0146993 A1 * | 10/2002 | Persico et al. | ............... | 455/126 |
| 2004/0235436 A1 * | 11/2004 | Chao et al. | ............... | 455/126 |

(Continued)

*Primary Examiner* — Simon Nguyen
(74) *Attorney, Agent, or Firm* — Thomas | Horstemeyer, LLP

(57) ABSTRACT

Methods and systems for level detector calibration are disclosed and may comprise calibrating a level detector integrated on-chip to eliminate an associated zero input offset voltage utilizing a replica bias circuit with no input ac voltage at the level detector or the replica bias circuit. The offset voltages of the level detector and the replica bias circuit may be combined to eliminate the associated zero input offset voltage of the level detector. The output signal may be generated by a difference of output signals from the level detector and the replica bias circuit. The level detector and the replica bias circuit may be biased utilizing a similar bias voltage. A plurality of known input voltages may be utilized to generate a corresponding plurality of output voltages of the level detector, generating a corrected transfer function that may be used to accurately set a transmitter power level.

20 Claims, 9 Drawing Sheets

(56) References Cited

U.S. PATENT DOCUMENTS

| | | | |
|---|---|---|---|
| 2004/0266371 A1* | 12/2004 | Summers et al. | 455/127.1 |
| 2005/0130595 A1* | 6/2005 | Shurvinton et al. | 455/67.11 |
| 2005/0168281 A1* | 8/2005 | Nagamori et al. | 330/133 |
| 2005/0195037 A1* | 9/2005 | Dupuis et al. | 330/279 |
| 2006/0028268 A1* | 2/2006 | Chen | 330/2 |
| 2006/0229036 A1* | 10/2006 | Muller et al. | 455/114.3 |
| 2006/0234661 A1* | 10/2006 | Toyota et al. | 455/252.1 |
| 2007/0111675 A1* | 5/2007 | Arayashiki et al. | 455/78 |
| 2007/0264946 A1* | 11/2007 | Rozenblit et al. | 455/127.1 |
| 2007/0287393 A1* | 12/2007 | Nandipaku et al. | 455/127.1 |
| 2010/0220243 A1* | 9/2010 | Chien et al. | 348/733 |

\* cited by examiner

METHOD AND SYSTEM FOR LEVEL DETECTOR CALIBRATION FOR ACCURATE TRANSMIT POWER CONTROL

CROSS-REFERENCE TO RELATED APPLICATIONS/INCORPORATION BY REFERENCE

This application is a continuation of U.S. application Ser. No. 11/618,832 filed Dec. 31, 2006, which makes reference to, claims priority to, and claims the benefit of U.S. Provisional Application Ser. No. 60/868,818, filed on Dec. 6, 2006.

The above stated application is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to controlling of circuits utilized in communication devices. More specifically, certain embodiments of the invention relate to a method and system for level detector calibration.

BACKGROUND OF THE INVENTION

A power amplification circuit in a wireless system is typically a large signal device. In wireless local area network (WLAN) systems, the power amplifier (PA) circuit may transmit output signals at average power levels in the range of 10 dBm to 20 dBm, and peak power levels of about 20 to 30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm.

The power output of a PA can be affected by the voltage level measured by a level detector. An inaccuracy in the level detector may cause the system to be designed with decreased output power of the PA, such that the FCC or standard's limit is never exceeded. If the uncertainty in the measured output power is 4 dB, for example, then the output power of the PA may have to be reduced by 4 dB below the FCC limit so as to never exceed that limit, greatly reducing the range of the transmitter Limitations in the performance of PA circuitry may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for power level detector calibration for accurate transmit power control, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for level detector calibration. Aspects of the invention may comprise calibrating a level detector integrated on-chip to eliminate an associated zero input offset voltage utilizing a replica bias circuit with no input ac voltage at either the level detector or the replica bias circuit. The offset voltages of the level detector and the replica bias circuit may be combined to eliminate the associated zero input offset voltage of the level detector. The output signal may be generated by a difference of an output signal from the level detector and an output signal from the replica bias circuit. The level detector and the replica bias circuit may be biased utilizing a similar bias voltage. A plurality of known input voltages may be utilized to generate a corresponding plurality of output voltages of the level detector. The known reference input voltages may be generated by clipping an input VCO signal and applying the signal to buffers.

Figure 1A:
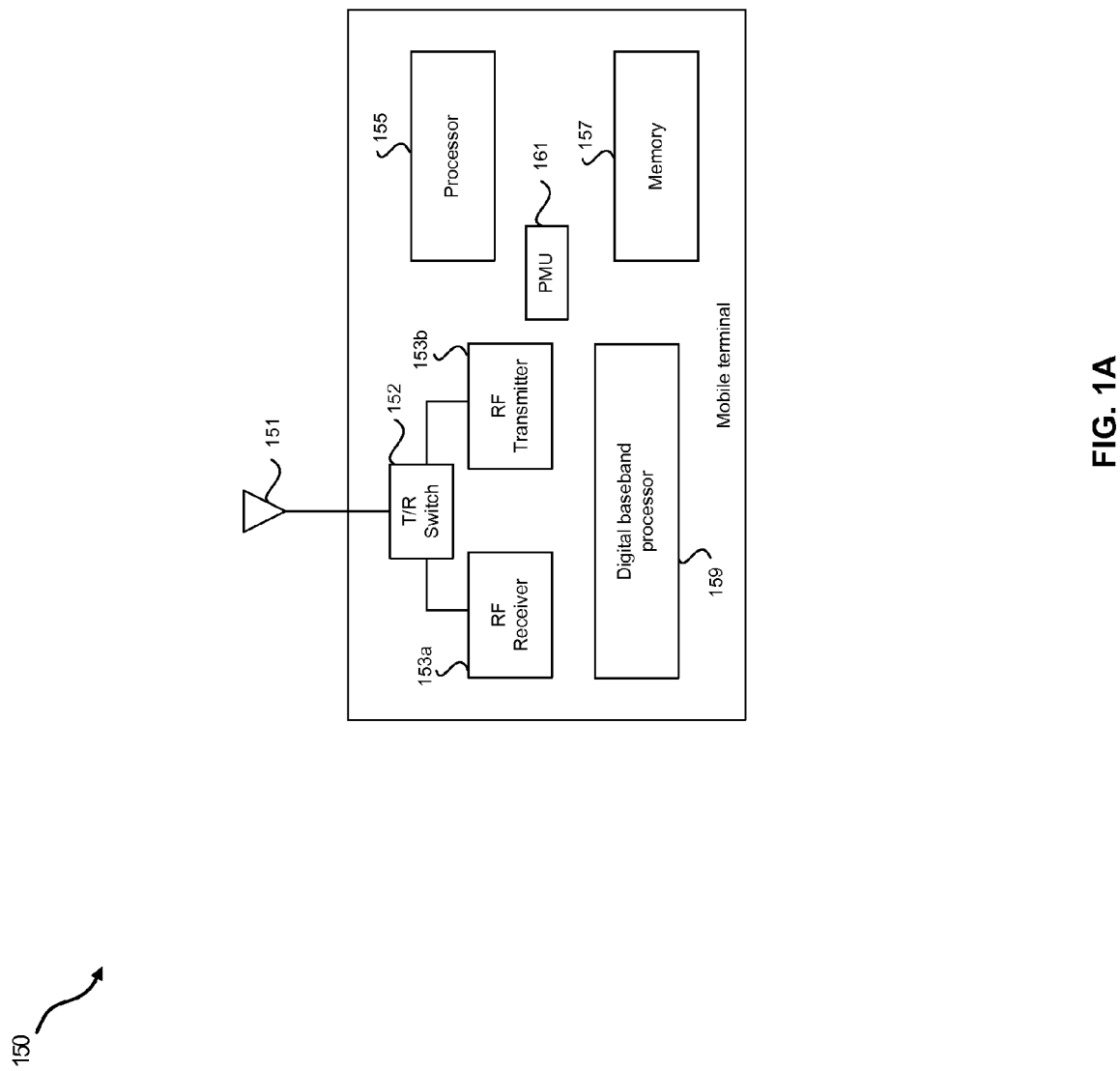
FIG. 1A is a block diagram illustrating an exemplary mobile terminal, which may be utilized in connection with an embodiment of the invention.

FIG. 1A is a block diagram illustrating an exemplary mobile terminal, which may be utilized in connection with an embodiment of the invention. Referring to FIG. 1A, there is shown mobile terminal 150 that may comprise an RF receiver 153a, an RF transmitter 153b, a T/R switch 152, a digital baseband processor 159, a processor 155, a power management unit (PMU) 161 and a memory 157. An antenna 151 may be communicatively coupled to the T/R switch 152. In instances when the T/R switch 152 is set to "R", or receive, the antenna 151 may be communicatively coupled to the RF receiver 153a, and in instances when the T/R switch 152 is set to "T", or transmit, the antenna 151 may be communicatively coupled to the RF transmitter 153b.

The RF receiver 153a may comprise suitable logic, circuitry, and/or code that may enable processing of received RF signals. The RF receiver 153a may enable receiving of RF signals in frequency bands utilized by various wireless communication systems, such as Bluetooth, WLAN, GSM, and/or WCDMA, for example.

The digital baseband processor 159 may comprise suitable logic, circuitry, and/or code that may enable processing and/or handling of baseband signals. In this regard, the digital baseband processor 159 may process or handle signals received from the RF receiver 153a and/or signals to be transferred to the RF transmitter 153b for transmission via a wireless communication medium. The digital baseband processor 159 may also provide control and/or feedback information to the RF receiver 153a and to the RF transmitter 153b, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the RF transmitter 153b for transmission to the wireless communication medium.

The RF transmitter 153b may comprise suitable logic, circuitry, and/or code that may enable processing of RF signals for transmission. The RF transmitter 153b may enable transmission of RF signals in frequency bands utilized by various wireless communications systems, such as Bluetooth, WLAN, GSM and/or WCDMA, for example.

The processor 155 may comprise suitable logic, circuitry, and/or code that may enable control and/or data processing operations for the mobile terminal 150. The processor 155 may be utilized to control at least a portion of the RF receiver 153a, the RF transmitter 153b, the digital baseband processor 159, and/or the memory 157. In this regard, the processor 155 may generate at least one signal for controlling operations within the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receiver 153a to enable receiving RF signals in the appropriate frequency band.

The power management unit 161 may comprise suitable logic, circuitry, and/or code that may enable the management of the power requirements of the components within the mobile terminal 150. The PMU 161 may generate a battery voltage signal, $V_{bat}$.

Figure 1B:
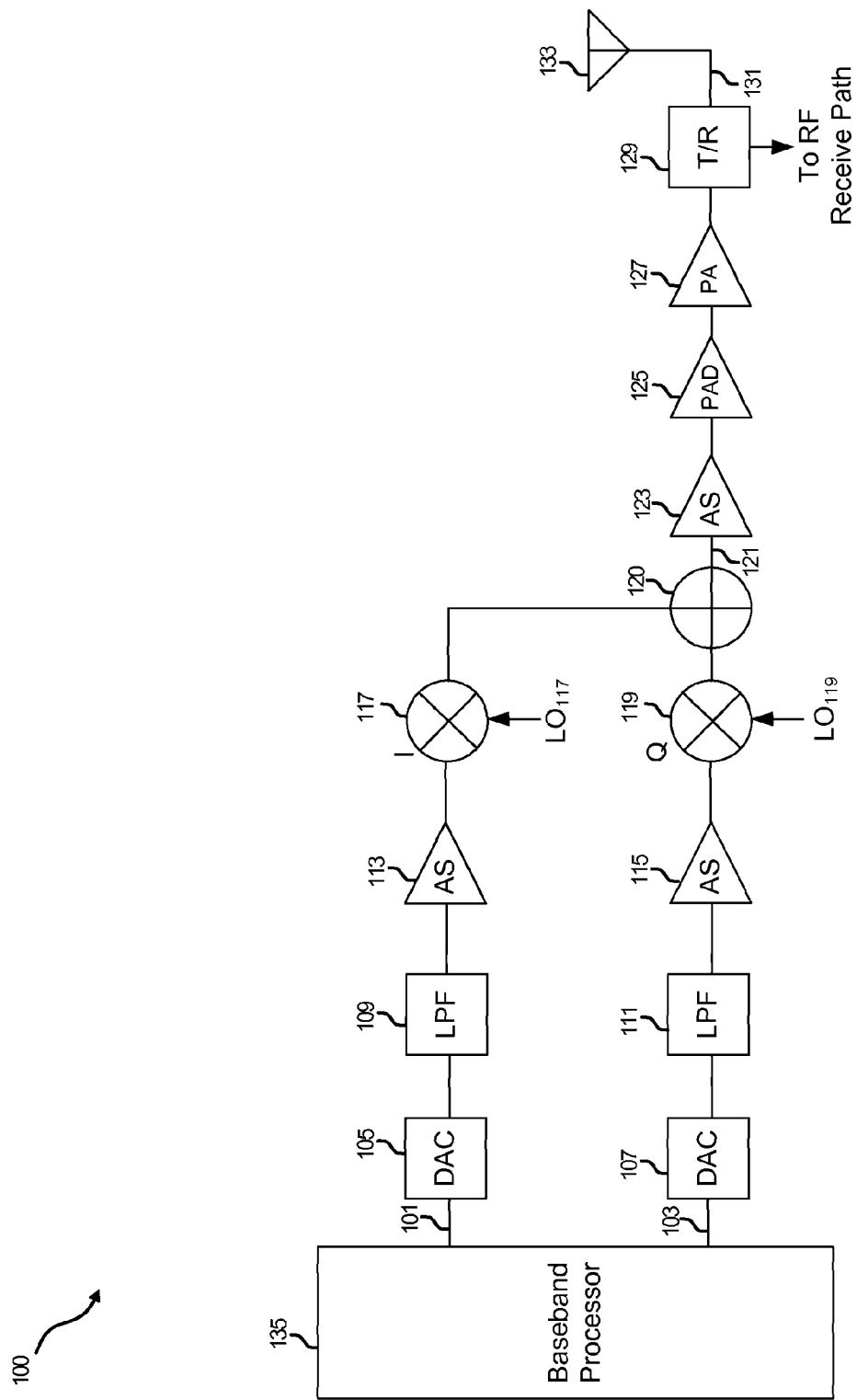
FIG. 1B is a block diagram of an exemplary I and Q transmit path, in accordance with an embodiment of the invention.

FIG. 1B is a block diagram of an exemplary I and Q transmit path, in accordance with an embodiment of the invention. Referring to FIG. 1B, there is shown transmit path 100 comprising digital to analog converters (DAC) 105 and 107, low pass filters 111 and 109, active stages (ASs) 113, 115, and 123, in-phase and quadrature up-conversion mixers 117 and 119, respectively, an adder 120, a power amplifier driver (PAD) 125, a power amplifier (PA) 127, a transmit/receive (T/R) switch 129, and an antenna 133. The in-phase path comprises the DAC 105, the LPF 109, the AS 113 and the in-phase up-conversion mixer 117. The quadrature path comprises the DAC 107, the LPF 111, the AS 115 and the quadrature up-conversion mixer 119. The exemplary polar transmitter 100 of FIG. 1B may be representative of the RF transmitter 153b of FIG. 1A.

The DAC 105 may comprise suitable circuitry, logic and/or code for converting a digital signal to an analog output. The DAC 105 may be enabled to receive an input signal, namely in-phase digital IF signal 101. The input digital signal may comprise one or more bits, which may represent a numerical value. The input digital signal may be a baseband signal, which may be mapped to a constellation point based on a modulation type. The mapped constellation point may be represented by an analog signal amplitude. The number of bits represented by an analog signal amplitude, or symbol, may be determined based on the modulation type. The DAC 105 may be enabled to generate an analog output signal, which may be communicated to an input of the low pass filter 109. The DAC 107 may be substantially similar to the DAC 105. Notwithstanding, the DAC 107 may be enabled to receive an input signal 103 from the baseband processor 135, and accordingly, generate an analog signal, which may be communicated to an input of the low pass filter 111.

The LPF 109 may comprise suitable circuitry, logic and/or code that may enable selection of a cutoff frequency, wherein the LPF 109 may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the LPF 109 may be implemented as a passive filter, such as one that utilizes resistor, capacitor, and/or inductor elements, or implemented as an active filter, such as one that utilizes an operational amplifier. The LPF 111 may be substantially similar to LPF 109. Notwithstanding, the LPF 111 may be enabled to receive an analog input signal from the DAC 107, and accordingly, generate a low pass filtered signal, which may be communicated to an input of the active stage 115.

The AS 113 may comprise suitable circuitry, logic and/or code that may enable attenuation of input signals to generate an attenuated output signal. The amount of attenuation that may be provided by the AS 113, as measured in dB for example, may be determined based on an input control signal, which may be generated by the processor 155 described with respect to FIG. 1A. The AS 113 may be enabled to receive an output signal generated by the LPF 109. The AS 113 may be enabled to generate an output signal with applied gain or attenuation that may be communicated to the in-phase up-conversion mixer 117. The AS 115 may be substantially similar to the AS 113. Notwithstanding, an input of the AS 115 may be coupled to an output of the low pass filter 111 and an output of the AS 115 may be coupled to an input of the mixer 119.

The in-phase up-conversion mixer 117 may comprise suitable circuitry, logic and/or code may enable generation of an RF signal by modulation of an input signal. The in-phase up-conversion mixer 117 may utilize an input local oscillator signal labeled as LO117 to modulate the input signal. The modulated signal may be an RF signal. The transmitter in-phase up-conversion mixer 117 may produce an RF signal for which the carrier frequency may be approximately equal to the frequency of the signal LO117. The in-phase up-conversion mixer 117 may be enabled to receive an output signal generated by the active stage 113 and to generate an output signal that may be communicated to the active stage 123. The quadrature up-conversion mixer 119 may be substantially similar to in-phase up-conversion mixer 117. Notwithstanding, an input of the quadrature up-conversion mixer 119 may be coupled to an output of the AS 115.

The adder 120 may comprise suitable circuitry, logic and/or code for receiving analog input signals and generating an output signal that may be a sum of the incoming signals. The adder 120 may be enabled to receive output signals generated by the in-phase up-conversion mixer 117 and quadrature up-conversion mixer 119, resulting in the signal 121.

The AS 123 may comprise suitable circuitry, logic and/or code that may enable attenuation of input signals to generate an attenuated output signal. The amount of attenuation that may be provided by the AS 123, as measured in dB for example, may be determined based on an input control signal, which may be generated by the processor 155 described with respect to FIG. 1A. The AS 123 may be enabled to receive an output signal generated by the adder 120. The AS 123 may be enabled to generate an output signal with applied gain or attenuation that may be communicated to the PAD 125.

The PAD 125 may comprise suitable circuitry, logic and/or code for receiving analog input signals and generating an output signal for driving a power amplifier. The PAD 125 may receive as inputs, control signals, which may be generated by the processor 155. The received control signal may be utilized to set a gain or attenuation level of the PAD 125. The PAD 125 may be enabled to receive the output signal generated by the AS 123. The PAD 115 may be enabled to generate an output signal that may be communicated to the PA 127.

The PA 127 may comprise suitable circuitry, logic and/or code that may enable amplification of input signals to generate a transmitted signal of sufficient signal power (as measured by dBm, for example) for transmission via a wireless communication medium. The PA 127 may receive as inputs, control signals, which may be generated by the processor 155. The received control signal may be utilized to set a gain or attenuation level of the PAD 127.

The transmit/receive (T/R) switch 129 may comprise suitable circuitry, logic and/or code for switching the antenna 133 between the transmit path 100 and an RF receiver. The antenna 133 may comprise suitable circuitry for transmitting or receiving an RF signal.

The baseband processor 135 may comprise suitable logic, circuitry, and/or code that may enable processing of binary data contained within an input baseband signal. The baseband processor 135 may be substantially similar to the digital baseband processor 159 described with respect to FIG. 1A. The baseband processor 135 may perform processing tasks, which correspond to one or more layers in an applicable protocol reference model (PRM). For example, the baseband processor 135 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 135 may be referred to as being within the digital domain. The baseband processor 135 may also generate control signals based on the processing of the input binary data.

In operation, the baseband processor 135 may generate data comprising a sequence of bits to be transmitted via a wireless communications medium. The baseband processor 135 may generate a control signal, which may be utilized to configure the RF transmit path 100 to transmit the data by utilizing a specified modulation type. Based on the specified modulation type, the baseband processor may send a portion of the data, an in-phase baseband (IBB) signal, to the DAC 105, and another portion of the data, a quadrature baseband (QBB) signal, to the 107. The DAC 105 may receive a sequence of bits and generate an analog signal comprising a sequence of symbols. The number of bits represented by an individual symbol may be determined based on the specified modulation type. The DAC 107 may similarly generate an analog signal.

The analog signals generated by the DAC 105 and the DAC 107 may comprise undesirable frequency components. The LPF 109 and the LPF 111 may attenuate signal amplitudes associated with these undesirable frequency components in signals generated by the DAC 105 and the DAC 107 respectively. The baseband processor 135 may configure the in-phase up-conversion mixer 117 to select a frequency for the LO117 signal utilized to modulate the filtered signal from the LPF 109. The modulated signal output from the in-phase up-conversion mixer 117 may comprise an I component RF signal. The baseband processor 135 may similarly configure the quadrature up-conversion mixer 119 to generate a Q component RF signal from the filtered signal from the LPF 111. The I component and Q component RF signals signals may be summed by the adder 120 at the output of the in-phase up-conversion mixer 117 and the quadrature up-conversion mixer 119 to generate a quadrature combined RF signal.

The AS 123 may amplify the quadrature combined RF signal, wherein the level of amplification provided by the AS 123 may be configured based on control signals generated by the baseband processor 135. The PAD 125 may provide a second stage of amplification for the signal generated by the AS 123, and the PA 127 may provide a third stage of amplification for the signal generated by the PAD 125. The amplified signal from the PA 127 may be transmitted to the wireless communications medium via the transmit antenna 133 in instances where the T/R switch 129 is set to "T", or transmit mode.

Figure 2:
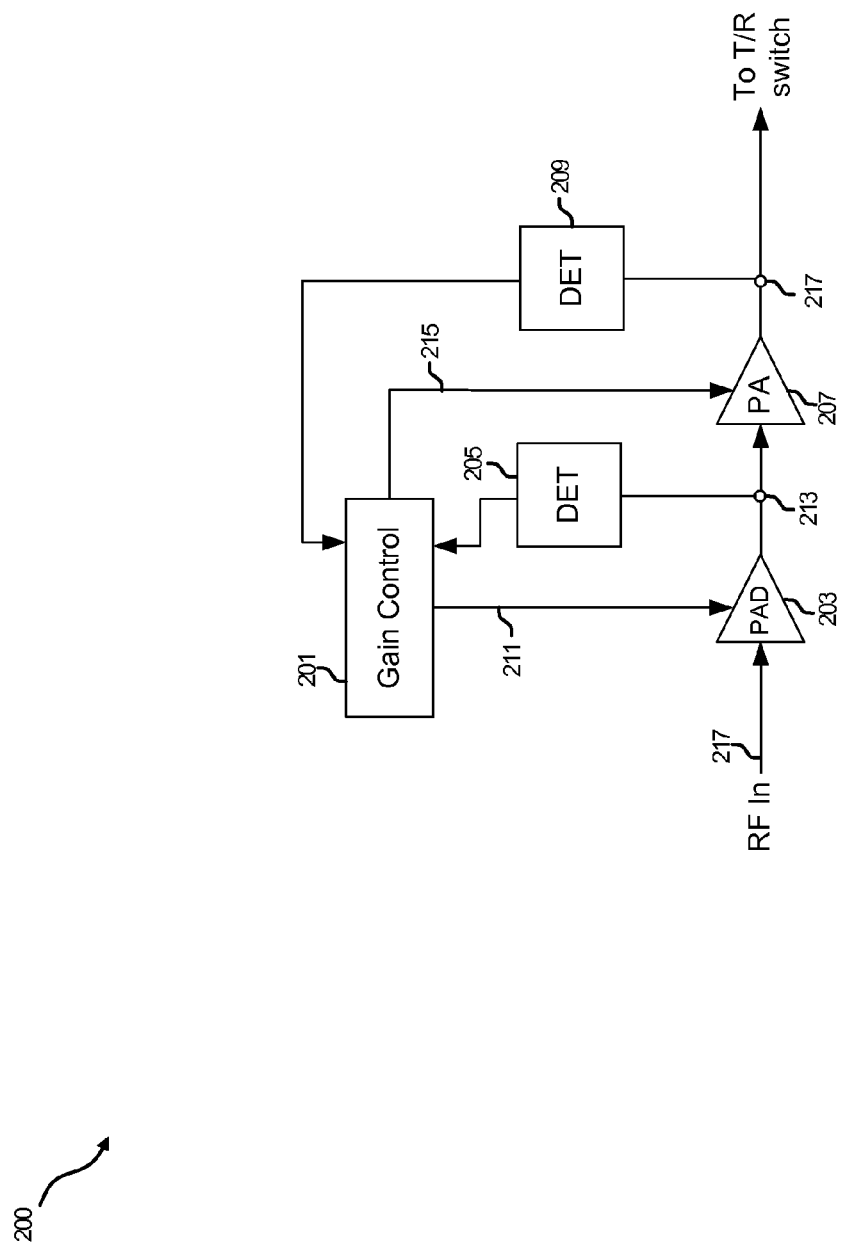
FIG. 2 is a block diagram of the output stages of an exemplary transmit path, in accordance with an embodiment of the invention.

FIG. 2 is a block diagram of the output stages of an exemplary transmit path, in accordance with an embodiment of the invention. Referring to FIG. 2, there is shown transmit path 200 comprising a gain control block 201, a PAD 203, level detectors 205 and 209 and a PA 207. A level detector may refer to a voltage detector, current detector or level detector. In each case, different implementations can detect the envelope, the peak, the average, or some other quantity of the said voltage, current or power. As an example, using a precisely calibrated voltage envelope detector, and knowing the output impedance of a PA, a precise mapping between the transmit power and the reading of the voltage envelope detector can be obtained and used to set the output transmit power accurately.

The PAD 203 may comprise suitable circuitry, logic and/or code for receiving analog input signals and generating an output signal for driving a power amplifier. The PAD 203 may receive as inputs, control signals from the gain control block 201 to set a gain or attenuation level of the PAD 203. The PAD 203 may be enabled to receive an RF signal from previous stages in the transmit chain, such as the active stage 123 described with respect to FIG. 1B. The PAD 203 may be enabled to generate an output signal that may be communicated to the PA 207.

The PA 207 may comprise suitable circuitry, logic and/or code that may enable amplification of input signals to generate a transmitted signal of sufficient signal power (as measured by dBm, for example) for transmission via a wireless communication medium. The PA 207 may receive as an input, control signals from the gain control block 201 to set a gain or attenuation level of the PA 207, and generate an output signal that may be communicated to the transmit/receive (T/R) switch 129 described with respect to FIG. 1B.

The level detectors 205 and 209 may comprise suitable circuitry, logic and/or code for detecting a voltage level of a signal. The level detectors 205 and 209 may comprise voltage, peak, envelope and/or average detectors. The level detectors 205 and 209 may be enabled to sense a voltage level and generate a signal to be communicated to the gain control block 201. Due to variations in the level detectors 205 and 209, the output signal may vary, causing the accuracy of the output power of the PA 207 determined by the gain control circuit 201 to degrade. In most applications where high output power may be desired, and with the maximum power limits set by the FCC or other regulatory bodies, it may be very advantageous to have an accurate measurement of signal voltages in each stage of a transmit path. Thus, a calibration of any offsets due to variations in the level detectors 205 and 209 may increase the possible output power of the PA 207.

In operation, the transmit path 200, may be enabled for receiving of an RF signal 217 and applying an appropriate gain to the signal such that the power transmitted by the antenna 133, described with respect to FIG. 1B, may be at a desired level. The RF signal 217 may be communicated to the PAD 203. The PAD 203 may provide gain or attenuation at a level determined by the gain control signal 211 from the gain control block 201. The output signal 213 of the PAD 203 may be communicated to the PA 207. The voltage of the output signal 213 may be measured by the level detector 205 and may be communicated to the gain control block 201. The PA 207 may provide gain or attenuation at a level determined by the gain control signal 215 from the gain control block 201. The voltage of the output signal 217 of the PA 207 may be measured by the level detector 209 and communicated to the gain control block 201. The output signal 217 of the PA 215 may be communicated to the T/R switch 129 described with respect to FIG. 1B.

Figure 3:
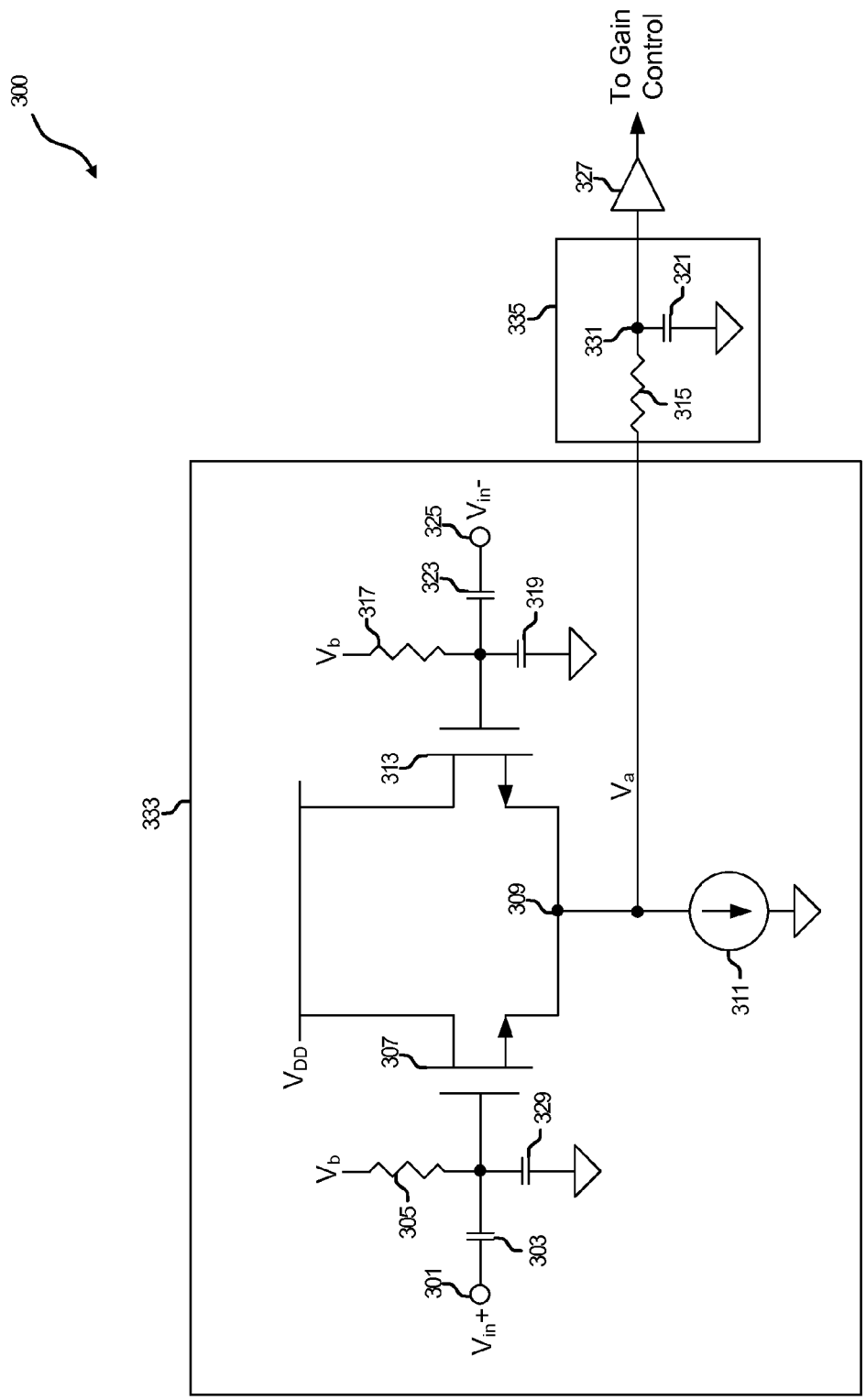
FIG. 3 is a block diagram of a level detector block, in accordance with an embodiment of the invention.

FIG. 3 is a block diagram of a level detector block, in accordance with an embodiment of the invention. Referring to FIG. 3, there is shown level detector block 300 comprising a level detector 333, a low pass filter 335, and a buffer 327. The term level detector may refer to any mechanism for estimating power using a voltage detector, a current detector or a power detector which may measure an envelope, an average, a peak, an rms value, etc. . . . The level detector 333 may comprise transistors 307 and 313, resistors 305 and 317, capacitors 303, 319, 323 and 329, and a current source 311. The low pass filter 335 may comprise a resistor 315 and a capacitor 321. The level detector block 300 may be substantially similar to the level detectors 205 and 209 described with respect to FIG. 2. In one embodiment of the invention, the transistors 307 and 313 may comprise CMOS transistors, and the buffer 327 may comprise an analog buffer amplifier.

The input signals $V_{in}+$ and $V_{in}-$ may be communicated to the inputs 301 and 325, respectively. The input signals may be AC coupled to the gates of the transistors 307 and 313 via the capacitors 303 and 323. One terminal of the capacitor 329 may be coupled to the gate of transistor 307 and the other terminal may be coupled to the circuit ground. One terminal of the resistor 305 may be coupled to the gate of transistor 307 and the other terminal may be coupled to a bias voltage $V_b$. One terminal of the capacitor 319 may be coupled to the gate of the transistor 313 and the other terminal may be coupled to the circuit ground. One terminal of the resistor 317 may be coupled to the gate of the transistor 313 and the other terminal may be coupled to a bias voltage $V_b$. The bias voltage, $V_b$, may be a constant voltage, independent of temperature or power supply voltage.

The drain terminals of the transistors 307 and 313 may be coupled to the supply voltage, $V_{DD}$. The source terminals of the transistors 307 and 313 may be coupled in a common source configuration with a current source 311 coupled from the coupled source terminals to the circuit ground. In addition, the source terminals of the transistors 307 and 313 may be coupled to resistor 315. The other end of resistor 315 may be coupled to the capacitor 321 and to an input of the buffer 327. The other end of the capacitor 321 may be coupled to the circuit ground.

In operation, the resistors 305 and 313 may be utilized to apply a bias voltage to the gates of the transistors 307 and 313. The input signals $V_{in}+$, $V_{in}-$, which may be modulated RF signals, may be AC coupled to the transistors 307 and 313 via capacitors 303 and 323. The transistors 307 and 313, which may be coupled in a common-source differential pair configuration, may amplify the input signals $V_{in}+V_{in}-$ and may generate a rectified output voltage signal, $V_a$, at the common source connection 309. The bias current for the common-source differential pair configured transistors 307 and 313 may be generated by the current source 311. The resistor 315 and the capacitor 321 may comprise a low-pass filter, which may generate a DC voltage 331 that may represent an average of the envelope of the modulated input signals $V_{in}+V_{in}-$. The DC voltage 331 may be communicated to an input of the buffer 327, and the output generated by the buffer 327 may be communicated to the gain control block 201 described with respect to FIG. 2.

Figure 4:
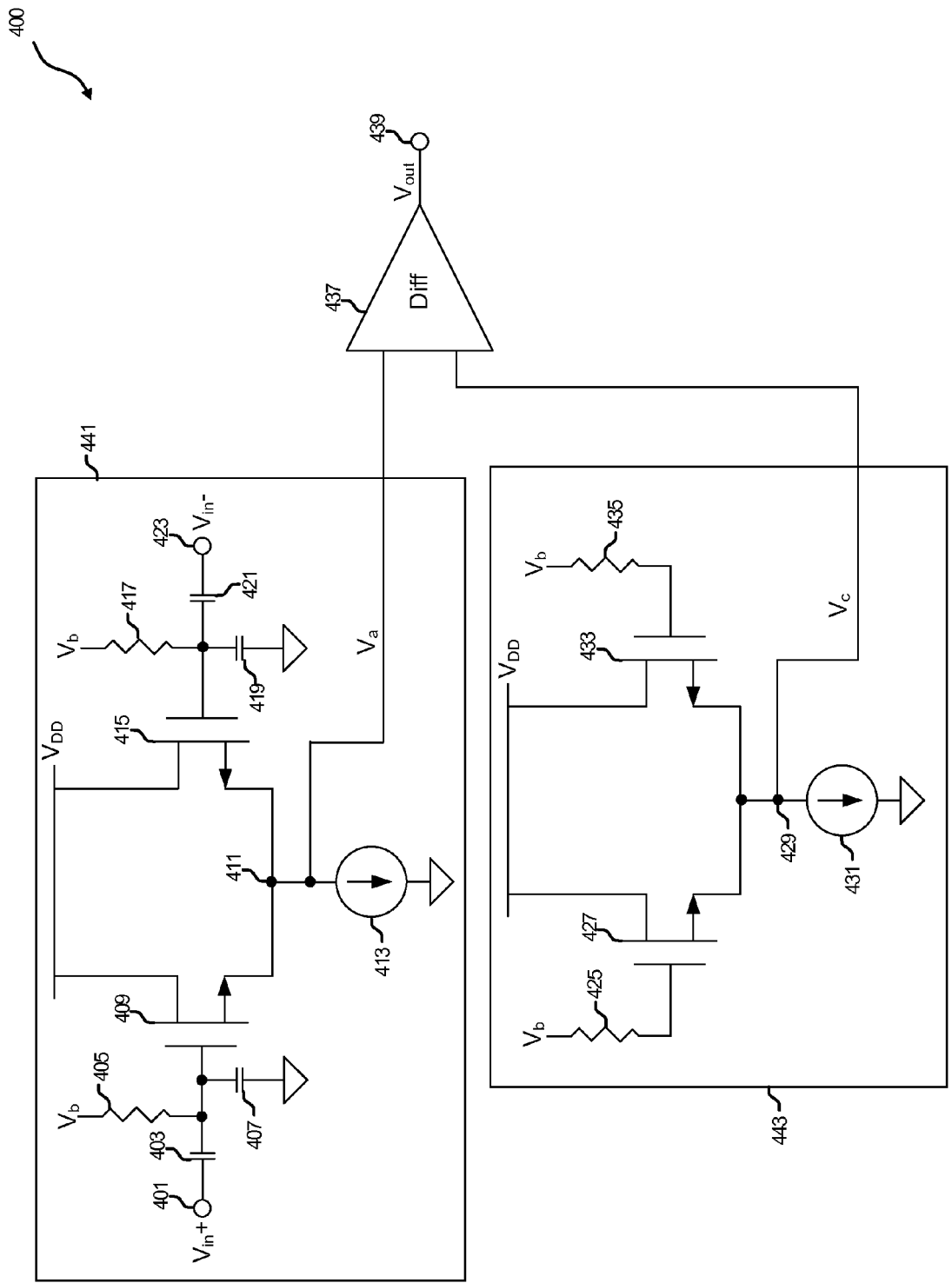
FIG. 4 is a block diagram of a level detector circuit for voltage offset calibration, in accordance with an embodiment of the invention.

FIG. 4 is a block diagram of a level detector circuit for voltage offset calibration, in accordance with an embodiment of the invention. Referring to FIG. 4, there is shown voltage offset calibration circuit 400 comprising a level detector 441, a replica bias circuit 443, and a difference amplifier 437. The level detector 441 may be substantially similar to the level detector 300 described with respect to FIG. 3, except that the output voltage $V_a$ 411 may be coupled to an input of the difference amplifier 437, as opposed to a low pass filter.

The level detector 441 may comprise resistors 405 and 417. The replica bias circuit 443 may comprise resistors 425 and 435, transistors 427 and 433, and a current source 431.

The resistors 425 and 435 may be utilized to apply a gate bias voltage, $V_b$, to the gates of the transistors 427 and 433, respectively. The bias voltage, $V_b$, may be a constant voltage, independent of temperature or power supply voltage. The drain terminals of the transistors 427 and 433 may be coupled to the supply voltage, $V_{DD}$. The source terminals of the transistors 427 and 433 may be coupled in a common source configuration with a current source 431 coupled from the common source terminals to the circuit ground. In addition, the source terminals of the transistors 427 and 433 may be coupled to another input of the difference amplifier 437. The difference amplifier may be enabled to generate an output voltage $V_{out}$ that may equal the difference between the inputs, $V_a$ and $V_c$.

In operation, the voltage offset calibration circuit 400 may be utilized to calibrate the level detector 441. Due to variations or mismatch in the components utilized in the level detector 441, temperature variations, process variations, a varying common mode voltage $V_a$ may be sensed even when no signal is applied to the inputs 401 and 423. For calibration, a null signal may be applied to inputs 401 and 423, and an offset voltage, $V_{a0}$, may be generated at the common source point 411. In one embodiment of the invention, the offset voltage $V_{a0}$ may be taken into account by gain control block 201 when generating gain control signals 211 and 215, described with respect to FIG. 2.

In another embodiment of the invention, as shown in FIG. 4, a replica bias circuit 443 may be biased with the same voltage $V_b$, but with no input signal terminals and thus no input signal at the gates of the transistors 427 and 433, such that the offset voltages $V_{a0}$, and $V_{c0}$ may be equal. This may be because both source coupled transistor pairs, comprising the transistor pairs 409/415 and 427/433 may be subjected to the same temperature and process variations, since they may be integrated on the same chip. Thus, the difference amplifier may generate an output signal $V_{out}$ that cancels the varying common mode voltage, resulting in an offset (common-mode) calibration of the level detector 441.

Figure 5:
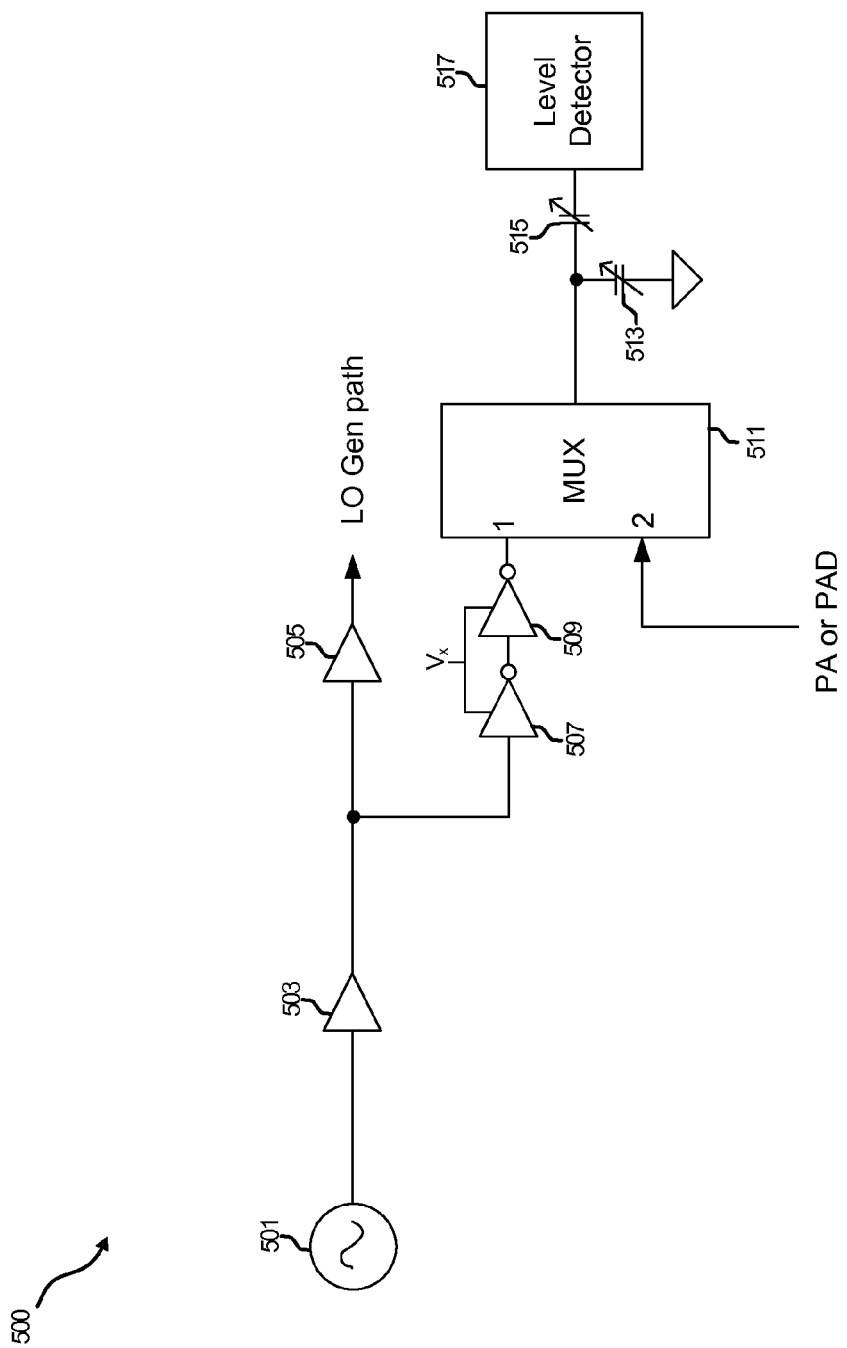
FIG. 5 is a block diagram of a level detector calibration circuit, in accordance with an embodiment of the invention.

FIG. 5 is a block diagram of a level detector calibration circuit, in accordance with an embodiment of the invention. Referring to FIG. 5, there is shown voltage calibration circuit 500 comprising a voltage controlled oscillator (VCO) 501, analog buffer amplifiers 503 and 505, CMOS buffers 507 and 509, a multiplexer (MUX) 511, variable capacitors 513 and 515, and a level detector 517. The level detector 517 may comprise a voltage, peak, envelope and/or average detector. The VCO 501 may be enabled to generate an output signal to be communicated to the analog buffer amplifier 503 at a frequency that may be a function of the voltage applied at the input. The output of the analog buffer amplifier 503 may be coupled to the inputs of the analog buffer amplifier 505 and the CMOS buffer 507. The output of the CMOS buffer 507 may be coupled to the input of CMOS buffer 509, and the output of CMOS buffer 509 may be coupled to an input of the MUX 511. Another input of the MUX 511 may be coupled to an output of a PAD or a PA, such as the PAD 125 or PA 127 described with respect to FIG. 1B. The output of the MUX may be coupled to two variable capacitors, 513 and 515. The other terminal of the variable capacitor 513 may be coupled to the circuit ground and the other terminal of the capacitor 515 may be coupled to the level detector 517.

The analog buffer amplifiers 503 and 505 may be utilized to provide isolation and buffering between stages of the local oscillator generator (LOGEN) path comprising VCO 501, and analog buffer amplifiers 503 and 505. The CMOS voltage buffers 507 and 509 may be utilized to provide limiting amplifiers for the RF signal generated by the LOGEN path, and may be supplied utilizing a known constant voltage $V_x$. The MUX may be utilized to select between signals generated by the buffer 509 and a PA or PAD.

In operation, the VCO may generate an RF signal that may be communicated to the CMOS buffer 507 via the analog buffer amplifier 503. The bias voltage, $V_x$, for the CMOS buffers 507 and 509 may be independent of temperature and supply voltage. The input signal communicated to the CMOS buffer 507 may cause the CMOS buffer 507 output to clip, or switch from rail to rail, defined by the known voltage $V_x$. This may be repeated by the CMOS buffer 509, generating a clipped, rail-to-rail square-wave voltage signal of a known magnitude.

In instances where the MUX 511 may select the input 1, the signal generated by the CMOS buffer 509 may be coupled to the variable capacitors 513 and 515. The variable capacitors may be adjusted to reduce the voltage level at the level detector 516 when the voltage may be high, such as when the PA or PAD input 2 is selected. The signal generated by the CMOS buffer 509 may be communicated to the level detector 517 via the variable capacitor 515. Thus, when a signal, $V_x$, of a known magnitude may be measured by the level detector 517, the resulting measurement may be an accurate calibration of the level detector 516. This calibration at a known voltage, along with the zero offset calibration described with respect to FIG. 4, may generate a calibration that may cover the voltage range that may be coupled to the level detector 517 during operation.

However, the voltage measured by the level detector 517 may not be linear with respect to an input signal generated by a PAD or PA. Multiple calibrations may be performed with multiple voltage levels, $V_x$ applied to the voltage buffers 507 and 509. In this manner, a level calibration, or transfer function, that may mitigate the non-linearity in the voltage measured by the level detector versus the input signal generated by a PAD or PA may be obtained. In other words, values obtained using each of the various $V_x$ values may be utilized to characterize the non-linearity and is described further with respect to FIG. 6.

In instances where the MUX 511 is set to input 2, the signal generated by a PAD or PA may be communicated to the level detector 517 via the MUX 511 and the variable capacitor 515. Due to the calibration of the level detector 517 over a range of input voltages, the accuracy of the measurement of the PAD or PA generated signals may be increased.

Figure 6:
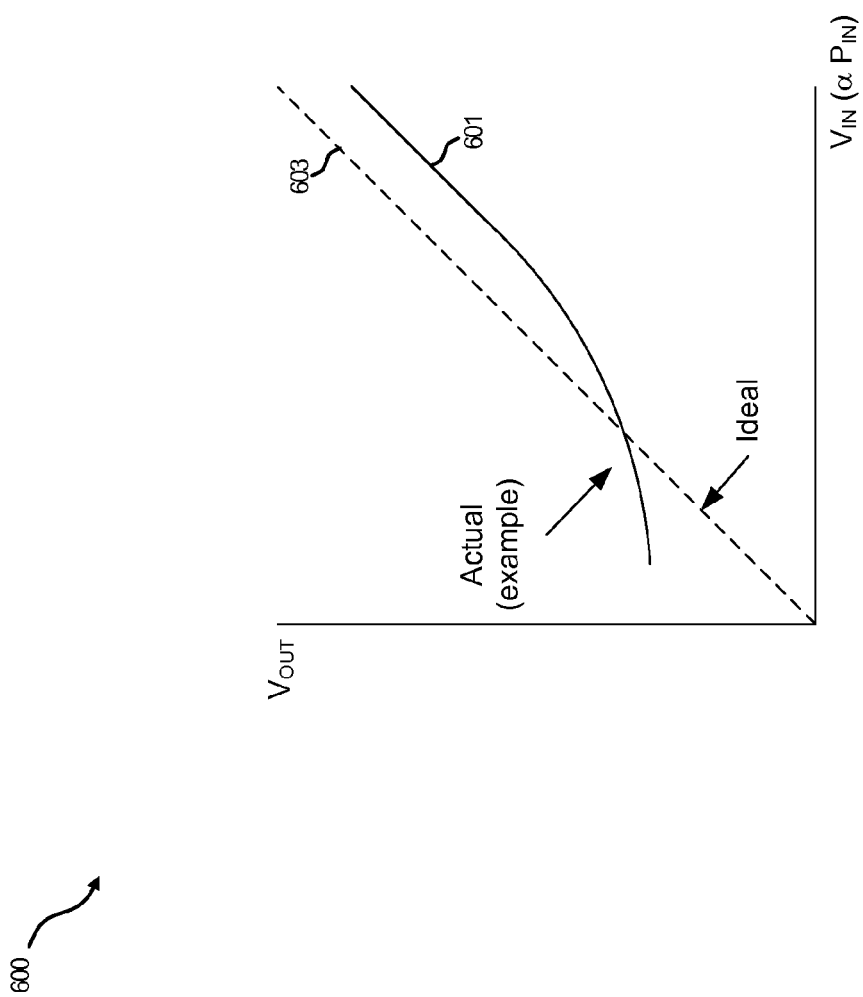
FIG. 6 is a block diagram illustrating an exemplary transfer function of a level detector, in accordance with an embodiment of the invention.

FIG. 6 is a block diagram illustrating an exemplary transfer function of a level detector, in accordance with an embodiment of the invention. Referring to FIG. 6, the y-axis comprises the output voltage, $V_{OUT}$, of the power amplifier 517 and the x-axis comprises the input signal voltage. The dashed line 603 represents an ideal transfer function, where the output voltage may be linear with input voltage, and may have zero offset voltage. In reality, level detector transfer functions may not be linear and may exhibit non-linearity, as shown in the exemplary calibrated transfer function 601. The calibrated transfer function 601 may be utilized to more accurately control the output power of a transmitter than if the ideal transfer function were assumed.

Figure 7:
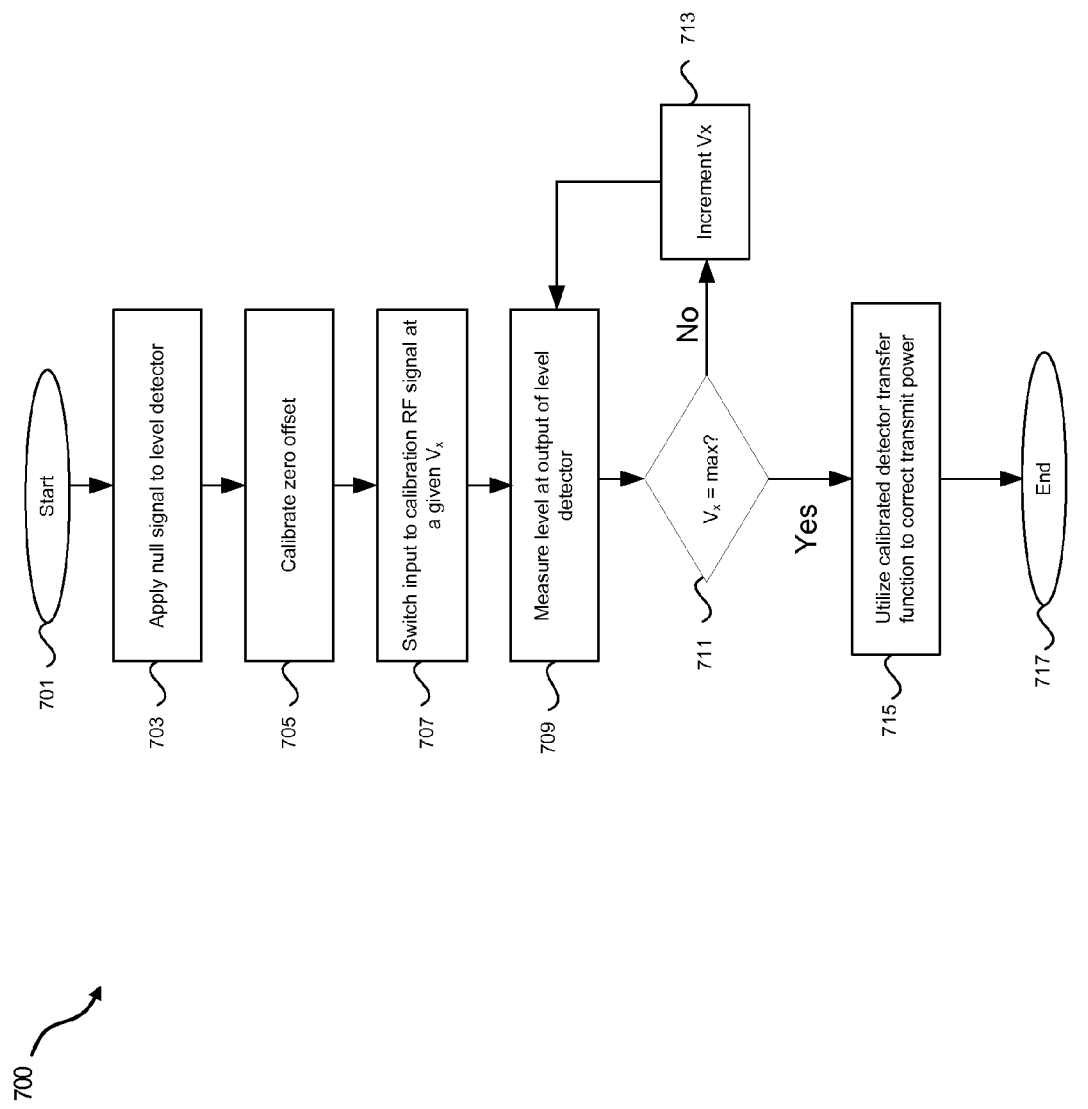
FIG. 7 is a flow diagram illustrating exemplary steps for level detector calibration, in accordance with an embodiment of the invention.

FIG. 7 is a flow diagram illustrating exemplary steps for level detector calibration, in accordance with an embodiment of the invention. Referring to FIG. 7 there is shown a flow diagram 700. After start step 701, in step 703, a null signal may be communicated to the level detector 441, which may comprise a voltage, peak, envelope or average detector, and in step 705 the zero offset may be determined. In step 707, the calibration RF signal at a given $V_x$ may be switched to the input of the level detector 517. In step 709, the level at the output of the level detector 517 voltage may be measured calibrating the level detector 517 at a known voltage $V_x$. In step 711, if the current $V_x$ is less than the maximum value, the magnitude of $V_x$ may be incremented in step 713, and the process repeats step 709. This may repeat until the maximum value of $V_x$ may be reached, at which time the process may proceed to step 715 where the calibrated detector transfer function may be utilized to control the transmit power. The process may then proceed to end step 717.

Figure 8:
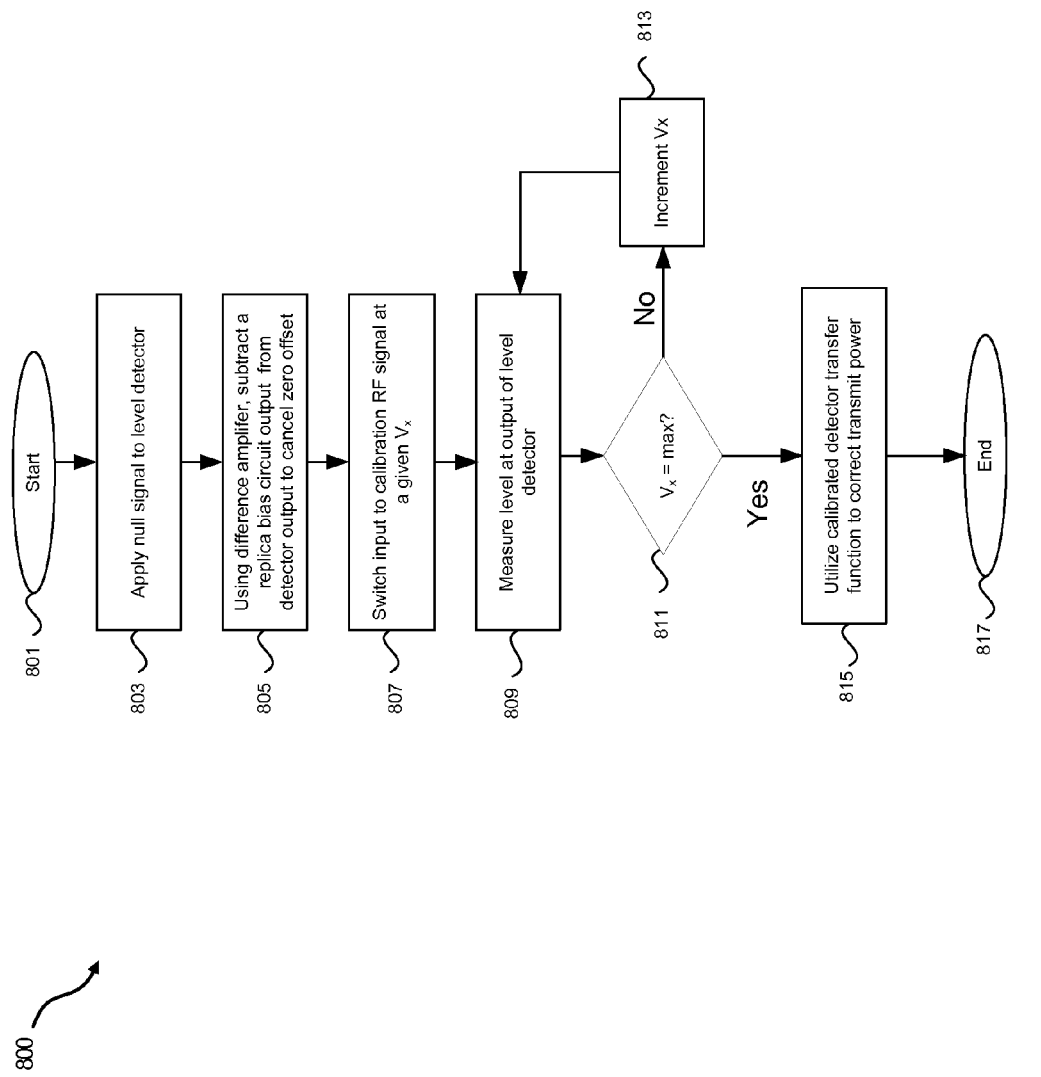
FIG. 8 is a flow diagram illustrating exemplary steps for level detector calibration utilizing a difference amplifier, in accordance with an embodiment of the invention.

FIG. 8 is a flow diagram illustrating exemplary steps for level detector calibration utilizing a difference amplifier, in accordance with an embodiment of the invention. Referring to FIG. 8 there is shown a flow diagram 800. After start step 801, in step 803, a null signal may be communicated to the level detector 441, which may comprise a voltage, peak, envelope or average detector, and in step 805 a difference amplifier 437 may be utilized to subtract a replica bias circuit 443 output from the level detector 441 output to cancel the zero offset of the level detector 441. In step 807, the calibration RF signal at a given $V_x$ may be switched to the input of the level detector 517. In step 809, a level at the output of the level detector 517 voltage may be measured calibrating the level detector 517 at a known voltage $V_x$. In step 811, if the current $V_x$ is less than the maximum value, the magnitude of $V_x$ may be incremented in step 813, and the process repeats step 809. This may repeat until the maximum value of $V_x$ may be reached, at which time the process may proceed to step 815 where the calibrated detector transfer function may be utilized to control the transmit power. The process may then proceed to end step 817.

In an embodiment of the invention a method, and system are described for level detector calibration and may comprise calibrating a level detector 441 integrated on-chip to eliminate an associated zero input offset voltage utilizing a replica bias circuit 443 with no input ac voltage at either the level detector 441 or the replica bias circuit 443. The offset voltages of the level detector 441 and the replica bias circuit 443 may be combined to eliminate the associated zero input offset voltage of the level detector 441. The output signal may be generated by a difference of an output signal $V_a$ from the level detector and an output signal $V_c$ from the replica bias circuit. The level detector 441 and the replica bias circuit 443 may be biased utilizing a similar bias voltage, $V_b$. A plurality of known input voltages, $V_x$, may be utilized to generate a corresponding plurality of output voltages of the level detector 441. The known reference input voltages, $V_x$, may be generated by clipping an input signal from a VCO 501 and applying the signal to analog buffer amplifier 503 and CMOS buffers 507 and 509.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling a circuit within a transmitter, the method comprising:
    canceling a zero input offset voltage from an output of a level detector;
    calibrating transmitter output signal strength over a range of input voltage values utilizing a known temperature-and-supply-voltage-independent voltage level by an on-chip voltage-controlled oscillator signal generator and the level detector by comparing a signal generated by said on-chip voltage-controlled oscillator signal generator to a signal received from an amplifier in the transmitter;
    generating a corrected transfer function to control transmit power, wherein the corrected transfer function characterizes non-linearity in voltage measured by the level detector versus the signal received from the amplifier; and
    utilizing the corrected transfer function to set output transmit power of the transmitter.

2. The method according to claim 1, comprising buffering an output signal of said on-chip voltage-controlled oscillator signal generator utilizing CMOS buffers biased with the known temperature-and-supply-voltage-independent voltage level.

3. The method according to claim 1, comprising comparing said signal generated by said on-chip voltage-controlled oscillator signal generator to said signal received from the amplifier in the transmitter by selecting between said generated signal and said received signal utilizing a multiplexer.

4. The method according to claim 1, comprising limiting a voltage received at said level detector utilizing variable capacitors.

5. The method according to claim 1, wherein said level detector comprises a peak detector.

6. The method according to claim 1, wherein said level detector comprises an envelope detector.

7. The method according to claim 1, wherein said level detector comprises an average detector.

8. The method according to claim 1, comprising generating the known temperature-and-supply-voltage-independent voltage level by clipping an input signal from the on-chip voltage-controlled oscillator signal generator.

9. The method according to claim 1, further comprising:
communicating a null signal as an input to the level detector; and
determining the zero input offset voltage associated with the level detector based on the null signal.

10. A system for controlling a circuit within a transmitter, the system comprising:
one or more circuits operable to cancel a zero input offset voltage from an output of a level detector;
one or more circuits operable to calibrate transmitter output signal strength over a range of input voltage values utilizing a known temperature-and-supply-voltage-independent voltage level by an on-chip voltage-controlled oscillator signal generator and the level detector by comparing a signal generated by said on-chip voltage-controlled oscillator signal generator to a signal received from an amplifier in the transmitter;
one or more circuits operable to generate a corrected transfer function to control transmit power, wherein the corrected transfer function characterizes non-linearity in voltage measured by the level detector versus the signal received from the amplifier; and
one or more circuits operable to utilize the corrected transfer function to set output transmit power of the transmitter.

11. The system according to claim 10, wherein said one or more circuits are operable to buffer an output signal of said on-chip voltage-controlled oscillator signal generator utilizing CMOS buffers biased with the known temperature-and-supply-voltage-independent voltage level.

12. The system according to claim 10, wherein said one or more circuits are operable to compare said signal generated by said on-chip voltage-controlled oscillator signal generator to said signal received from the amplifier in the transmitter by selecting between said generated signal and said received signal utilizing a multiplexer.

13. The system according to claim 10, wherein said one or more circuits are operable to limit a voltage received at said level detector utilizing variable capacitors.

14. The system according to claim 10, wherein said level detector comprises a peak detector.

15. The system according to claim 10, wherein said level detector comprises an envelope detector.

16. The system according to claim 10, wherein said level detector comprises an average detector.

17. The system according to claim 10, further comprising one or more circuits operable to generate the known temperature-and-supply-voltage-independent voltage level by clipping an input signal from the on-chip voltage-controlled oscillator signal generator.

18. The system according to claim 10, further comprising:
one or more circuits operable to communicate a null signal as an input to the level detector; and
one or more circuits operable to determine the zero input offset voltage associated with the level detector based on the null signal.

19. A non-transitory computer readable medium embodied with computer executable instructions, which when executed by a computer, causes the computer to:
communicate a null signal as an input to a level detector;
determine a zero input offset voltage associated with the level detector based on the null signal;
cancel the zero input offset voltage from an output of the level detector;
calibrate transmitter output signal strength over a range of input voltage values utilizing a known temperature-and-supply-voltage-independent voltage level by an on-chip voltage-controlled oscillator signal generator and the level detector by comparing a signal generated by said on-chip voltage-controlled oscillator signal generator to a signal received from an amplifier in the transmitter;
generate a corrected transfer function to control transmit power, wherein the corrected transfer function characterizes non-linearity in voltage measured by the level detector versus the signal received from the amplifier; and
utilize the corrected transfer function to set output transmit power of the transmitter.

20. The non-transitory computer readable medium of claim 19, further causing the computer to generate the known temperature-and-supply-voltage-independent voltage level by clipping an input signal from the on-chip voltage-controlled oscillator signal generator.

* * * * *